United States Patent
Petrovic et al.

(10) Patent No.: US 9,312,880 B2
(45) Date of Patent: Apr. 12, 2016

(54) METHOD AND APPARATUS FOR SPECTRUM SPREADING OF A PULSE-DENSITY MODULATED WAVEFORM

(71) Applicant: Entropic Communications, Inc., San Diego, CA (US)

(72) Inventors: Branislav Petrovic, La Jolla, CA (US); Carl Harry Alelyunas, Austin, TX (US)

(73) Assignee: ENTROPIC COMMUNICATIONS, LLC, Carlsbad, CA (US)

( * ) Notice: Subject to any disclaimer, the term of this patent is extended or adjusted under 35 U.S.C. 154(b) by 22 days.

(21) Appl. No.: 14/280,412

(22) Filed: May 16, 2014

(65) Prior Publication Data

US 2015/0295619 A1    Oct. 15, 2015

Related U.S. Application Data

(60) Provisional application No. 61/978,438, filed on Apr. 11, 2014.

(51) Int. Cl.

| | | |
|---|---|---|
| *H03K 7/08* | (2006.01) | |
| *H03M 3/00* | (2006.01) | |
| *H04L 25/49* | (2006.01) | |
| *H04B 1/692* | (2011.01) | |
| *H04B 1/717* | (2011.01) | |
| *H04B 1/707* | (2011.01) | |
| *H04B 1/7163* | (2011.01) | |

(52) U.S. Cl.
CPC ............. *H03M 3/506* (2013.01); *H04B 1/692* (2013.01); *H04B 1/7172* (2013.01); *H04L 25/4902* (2013.01); *H04B 1/707* (2013.01); *H04B 1/71632* (2013.01); *H04B 2201/71638* (2013.01)

(58) Field of Classification Search
CPC .................... H03F 2200/345; H03F 2200/331; H03F 2200/348; H03B 23/00; H03M 3/344; H03M 1/66; H03M 3/368; H03M 3/30; H03K 7/08; H04L 25/4902; H04L 27/36
USPC .......... 375/259, 238, 295, 316, 237; 341/126, 341/144; 329/311, 312; 327/31, 37; 370/205
See application file for complete search history.

(56) References Cited

U.S. PATENT DOCUMENTS

| | | |
|---|---|---|
| 6,459,398 B1 * | 10/2002 | Gureshnik et al. ............ 341/144 |
| 2014/0043176 A1 * | 2/2014 | Tomasovics et al. ......... 341/143 |
| 2014/0266833 A1 * | 9/2014 | Kris et al. ..................... 341/144 |

* cited by examiner

*Primary Examiner* — Tesfaldet Bocure
(74) *Attorney, Agent, or Firm* — McAndrews, Held & Malloy, Ltd.

(57) ABSTRACT

A spreading method and apparatus for spreading the spectral density of a pulse stream by summing a set of randomly selected zero-sum sequences to an incoming pulse stream and ensuring that the number of pulses output by the spreading method and apparatus is equal to the number of pulses input to the spreading method and apparatus.

17 Claims, 8 Drawing Sheets

| Input # | $t_0$ | $t_1$ | $t_2$ | $t_3$ | $t_4$ | $t_5$ | $t_6$ | $t_7$ |
|---|---|---|---|---|---|---|---|---|
| 1 | 0 | 1 | 1 | 0 | 0 | 1 | 0 | 1 |
| 2 | -1 | 1 | -1 | 1 | 1 | -1 | 1 | -1 |
| 3 | 0 | -1 | 1 | 0 | 1 | 1 | 0 | 1 |
| 4 | 0 | 0 | -1 | 0 | -1 | -1 | 0 | -1 |
| Accumulator Output | -1 | 1 | 0 | 1 | 1 | 0 | 1 | 0 |
| Spreading Circuit Output | 0 | 0 | 1 | 0 | 1 | 1 | 0 | 1 |

METHOD AND APPARATUS FOR SPECTRUM SPREADING OF A PULSE-DENSITY MODULATED WAVEFORM

RELATED APPLICATIONS

This application claims priority benefit of U.S. Provisional Patent Application Ser. No. 61/978,438, filed Apr. 11, 2014 and entitled "Method and Apparatus for Spectrum Spreading of a Pulse-Density Modulated Waveform", which is herein incorporated by reference in its entirety.

TECHNICAL FIELD

The disclosed method and apparatus relate to digital to analog converters and more particularly to pulse density modulation digital to analog converters.

BACKGROUND

Designers of digital to analog converters (DACs) face several challenges today. One such challenge presents itself when attempting to perform digital to analog conversion using the well-known pulse-width modulation technique. FIG. 1 is a simplified schematic of a pulse-width modulation (PWM) DAC.

The challenge facing DAC designers attempting to use PWM DACs is providing a desired number of voltage steps within the constraints of the filters that are currently practically available.

FIG. 1 is a simplified block diagram of a PWM DAC 100. Digital input values 102 to be converted to an analog amplitude output 104 are stored in a Pulse Width Register 106. A Max Value Register 108 is loaded with a terminal or maximum value. The maximum value 109 is loaded into a reloadable counter 110. The reloadable counter 110 generates a ramp signal output 112 at a rate determine by a signal output from a clock 111. That is, the digital value output from the counter 110 will increase linearly from a starting value to the maximum value 109 stored in the Max Value Register 108.

FIG. 2 is an illustration of the waveforms created by the PWM DAC 100. When the value 112 output from the counter 110 reaches the maximum value 109, the counter output value 112 returns to the starting value 204 (typically zero). Referring back to FIG. 1, the output 112 from the counter 110 is coupled to a comparator 114. The comparator 114 compares the value 112 output from the counter 110 to the value 116 output from a Pulse Width Register 106. When the value 112 of the ramping signal output from the counter 110 is less than the value 116 in the Pulse Width Register 106, the output 118 of the comparator 114 is high.

At the point 206 where the value of the ramping signal 112 output from the counter 110 crosses the value held in the Pulse Width Register 106, the comparator output 118 goes low. The correlation between the point 206 and the state of the output 118 is illustrated by a dashed line 208. It can be seen from FIG. 2 that by moving the value 116 up, the pulse width of the output 118 (i.e., the amount of time the pulse is high) will increase. By moving the value 116 down, the pulse width of the output 118 will decrease. That is, the crossing point 206 moves to the left as the value 116 goes down and moves to the right as the value 116 goes up.

It can be seen from FIG. 2 that the output 109 of the Max Value Register 108 sets the length of a cycle (i.e., the distance between rising edges of the output 118). The output 118 of the comparator 114 is then applied to a filter 120. The filter 120 integrates the output 118 to create a signal with an amplitude that is proportional to the value loaded into the Pulse Width Register 106. Thus, the circuit acts as a DAC that converts the digital input signal 102 to an analog output signal 104.

It should be noted that the duty cycle of the output 118 is 50% when the value of the input signal 102 is midway between the maximum and minimum values. Therefore, the maximum power resides at a frequency determined by the Max Value Register 108 and the frequency of the clock 111. It should also be noted that this is the lowest frequency generated in the spectrum of the output 118. That means that filter 120 has to be efficient at the low end of the spectrum in order to perform well. This poses challenges for the design of the DAC. This is even more difficult when there is a desire to have a large number of voltage steps. That is, when the number of bits in the Pulse Width Register 106 is high (i.e., the resolution of the PWM is high), the frequencies that must be passed include relatively high frequencies as the value of the Pulse Width Register 106 approaches the maximum value or the minimum value.

One way to mitigate the difficulties in making a filter suited to the task is to shift the relationship between the frequency of the output 118 and the amplitude of the digital input signal (i.e., the magnitude of the value stored in the Pulse Width Register 106). One way to shift this relationship is to use a pulse density modulation (PDM) DAC.

FIG. 3 is a simplified schematic of a PDM DAC 300. The PDM DAC 300 works in a manner similar to that of the PWM DAC 100. However, the output port 312 of the counter 310 is coupled to a bit reversal module 313. The bit reversal module outputs a value 315 that is a mirror image of the input value 312. The output of the counter 310 is synchronized by a clock signal 311 from a clock 317.

FIG. 4 illustrates the bit reversal for one set of example values 312, 315. The least significant bit (LSB) D0 is swapped with the most significant bit (MSB) D7. The next least significant bit D1 is swapped with the next most significant bit D6. This continues for each of the 8 bits shown in FIG. 4. Accordingly, the value of 312 read from left to right is equal to the bit reversed value of 315 when read from right to left. Such bit reversal can be accomplished by a last-in, first-out register.

FIG. 5 is an illustration of the output 315 of the bit reversal module 313 and the output 318 of the comparator 314. The pattern created at the output 315 of the bit reversal module 313 causes the output 315 to oscillate between values in a pattern that repeats when the counter 310 reaches the max value 309. The output 315 of the bit reversal module 313 is compared with the output 316 of a Pulse Density Register 306. A first dashed line 503 represents the minimum value that the output 316 of the Pulse Density Register 306 can take. A second dashed line 505 represents the maximum value that the output 316 of the Pulse Density Register 306 can take.

A horizontal line 507 is shown in FIG. 5 to represent a value output from the Pulse Density Register 306 that is approximately mid-range between the maximum value 505 and the minimum value 503. It can be seen from the plot of the output 315 of the bit reversal module 313 that as the value in the Pulse Density Register 306 increases from the mid-range value 507 to the maximum value 505, the number of times the output 315 of the bit reversal module 313 crosses the value output by the Pulse Density Register 306 decreases. Likewise, as the value decreases from the mid-range value 507, the number of times the output 315 of the bit reversal module 313 crosses the value decreases. Therefore, the output 318 will have the highest pulse density (and so a higher frequency in the frequency domain) at values closest to mid-range. The frequency will decrease as the pulse density value 316 increases or decreases from mid-range.

Using the PDM DAC 300 rather than the PWM DAC 100 results in an output for which it is easier to design a filter. However, the comparator output 318 will be a relatively consistent stream of pulses for most values stored in the Pulse Density Register 306. Such consistent streams of pulses can cause interference with other nearby circuits.

Accordingly, there is presently a need for an ADC that can convert digital signals to analog signals, both without requiring a filter that is difficult to design and without generating pulse streams that can interfere with other circuits.

SUMMARY

Various embodiments of the disclosed method and apparatus for converting digital signals to analog signals are presented. Some of these embodiments are directed toward systems and methods for spreading the energy output from a digital to analog converter (DAC) over a frequency spectrum to reduce the likelihood that the DAC will create spurious signals that will interfere with other nearby circuits.

In accordance with the disclosed method and apparatus, a spectral spreading circuit randomizes the frequency output from a PDM DAC. The randomized output will have essentially the same amount of time in the high state over a predetermined interval of time as the output by the PDM waveform applied to the input port of the spreading circuit. This keeps the average voltage output from a filter coupled to the output of the spreading circuit approximately the same as would be the case were the filter coupled to the output port of the PDM DAC without spreading.

Spreading is accomplished by shifting the position of the pulses randomly within a constrained range. Incoming pulses increment an accumulator (i.e., a summing circuit), and the outgoing pulses decrement the accumulator. A randomized stream of 1's and −1's is added to the accumulator. The number of 1's and the number of −1s are equal, resulting in a net zero gain. Accordingly, the accumulator output has the same number of positive pulses per unit time on the output as the number of positive pulses on the input. This allows the average level of the spread output to be the same as average level output from the PDM DAC that feeds the spreading circuit.

BRIEF DESCRIPTION OF THE DRAWINGS

The disclosed method and apparatus, in accordance with one or more various embodiments, is described with reference to the following figures. The drawings are provided for purposes of illustration only and merely depict examples of some embodiments of the disclosed method and apparatus. These drawings are provided to facilitate the reader's understanding of the disclosed method and apparatus. They should not be considered to limit the breadth, scope, or applicability of the claimed invention. It should be noted that for clarity and ease of illustration these drawings are not necessarily made to scale.

FIG. 4 is an illustration of the relationship between the input and output of a prior art bit reversal module.

FIG. 7 is a table of the values applied to the input ports to the accumulator of FIG. 6 and at the output of the spreading circuit of FIG. 6.

The figures are not intended to be exhaustive or to limit the claimed invention to the precise form disclosed. It should be understood that the disclosed method and apparatus can be practiced with modification and alteration, and that the invention should be limited only by the claims and the equivalents thereof.

DETAILED DESCRIPTION

Figure 6:
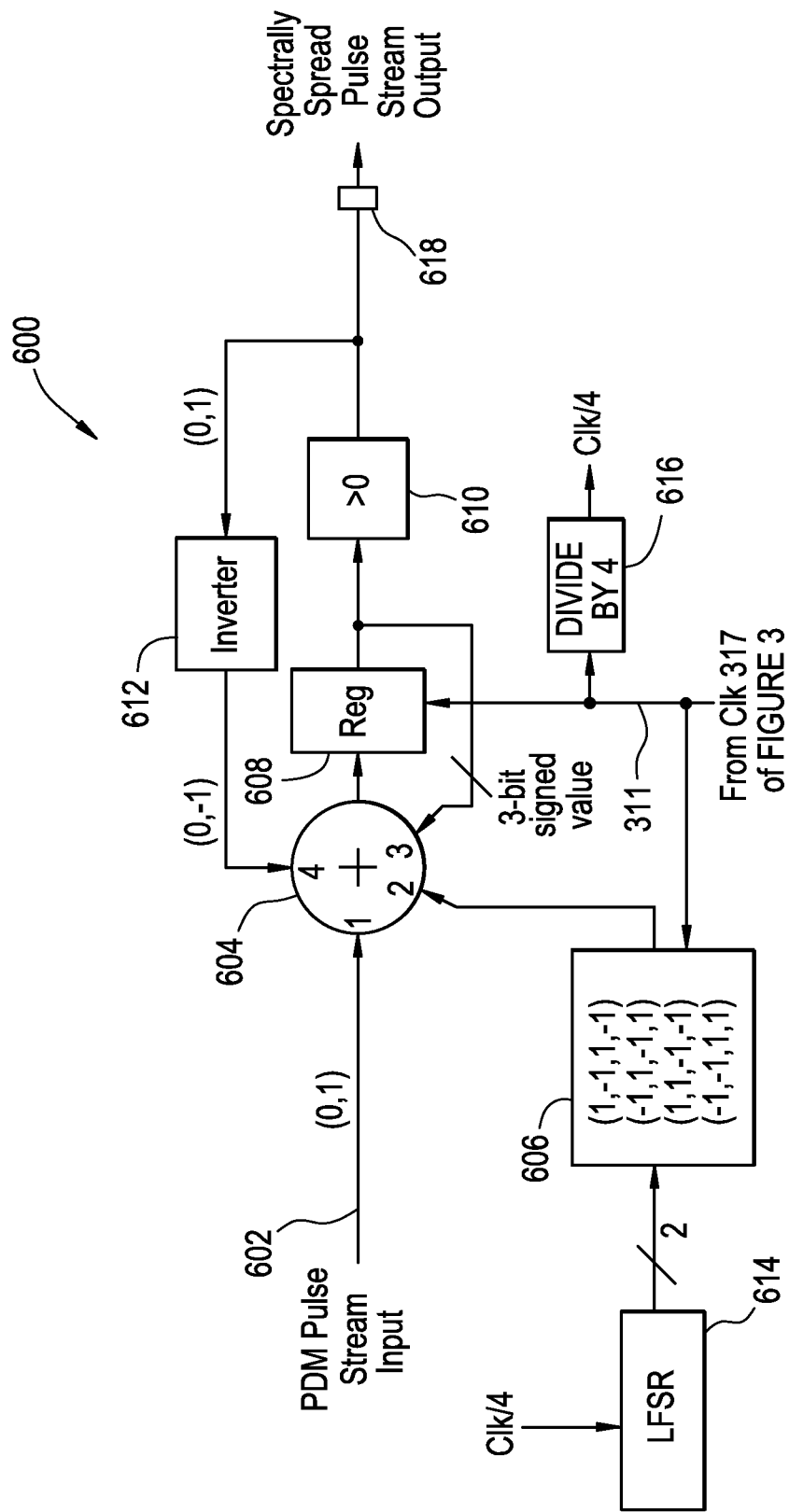
FIG. 6 is a simplified schematic of a spreading circuit in accordance with one embodiment of the presently disclosed method and apparatus.

FIG. 6 is a simplified schematic of a spreading circuit 600 in accordance with one embodiment of the presently disclosed method and apparatus. The spreading circuit 600 receives a stream of PDM pulses 602 from a source, such as the PDM DAC shown in FIG. 300. It should be understood that the PDM pulse stream can come from any source. The PDM pulses 602 are a series of pulses representing the analog value of a digital input. It should be noted that the output filter 320 is used to smooth the pulses (integrate the output) to generate an analog signal. Therefore, the output from the PDM DAC is coupled to the spreading circuit prior to being filtered. The spreading circuit includes: a random source, such as a linear feedback shift register (LFSR); a Zero-Sum Sequence Register 606; an accumulator 604, such as a summing module; an accumulation register 608; a comparator 610; and an inversion module 612.

The PDM pulse stream 602 is received and coupled to the first of four input ports to the accumulator 604. Input port 2 to the accumulator is coupled to the Zero-Sum Sequence Register 606. The Zero-Sum Sequence Register 606 provides a stream of bits that can have values of either 1 or −1, and which, when summed together, equal zero (i.e., an equal number of 1s and −1s). For example, a four value wide Zero-Sum Sequence Register 606 could have the following sets of values (1,−1,1,−1); (−1,1,−1,1); (1,1,−1,−1); and (−1,−1,1,1) stored therein. As noted above, each of the four values in each set sums to zero. Furthermore, as noted by the fact that the values can be either 1 or −1, the output from the Zero-Sum Sequence Register 606 is a signed value, such as a 2-bit signed two's complement output. However, any set of bits that can represent the values of 1 and −1 can be output by the Zero-Sum Sequence Register 606.

Figure 1:
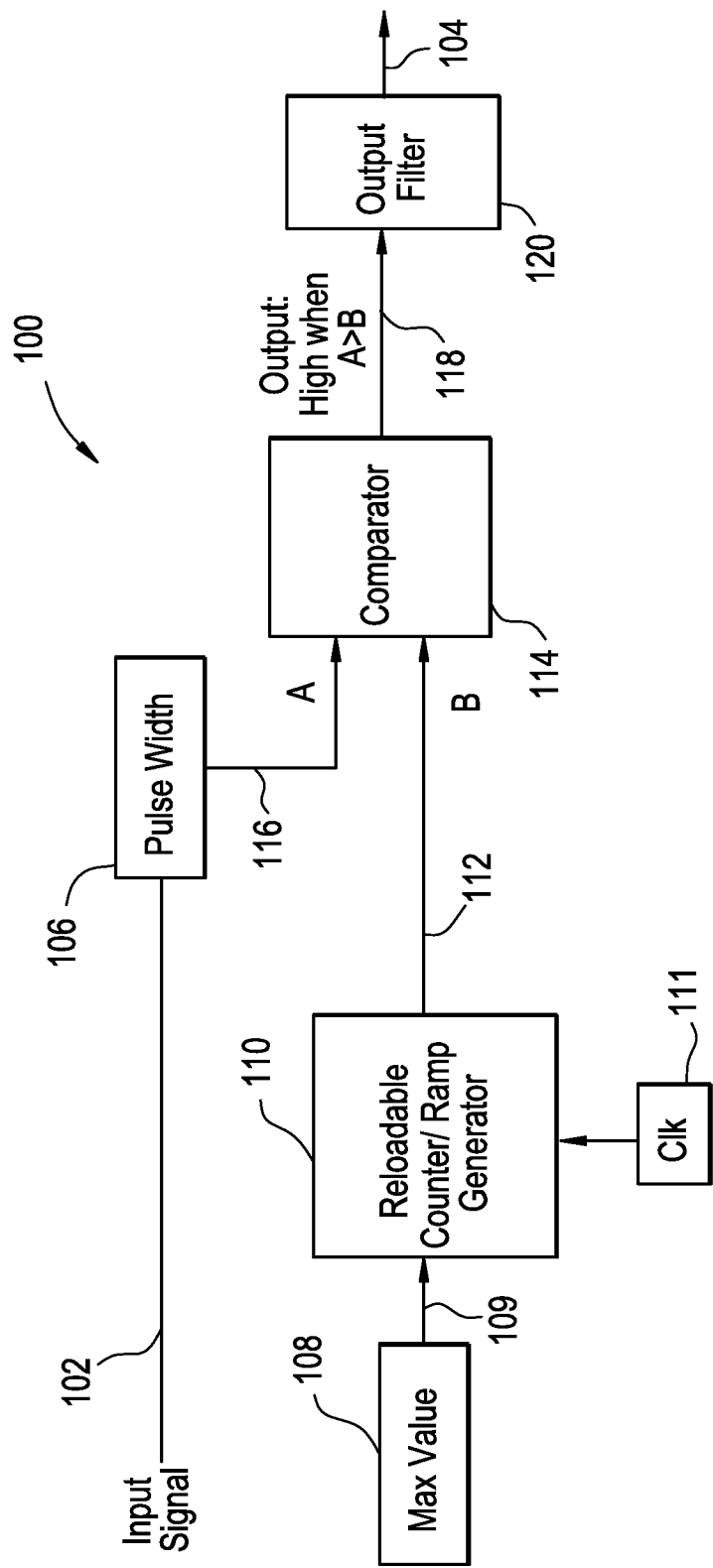
FIG. 1 is a simplified block diagram of a prior art pulse width modulation (PWM) digital to analog converter (DAC).
Figure 2:
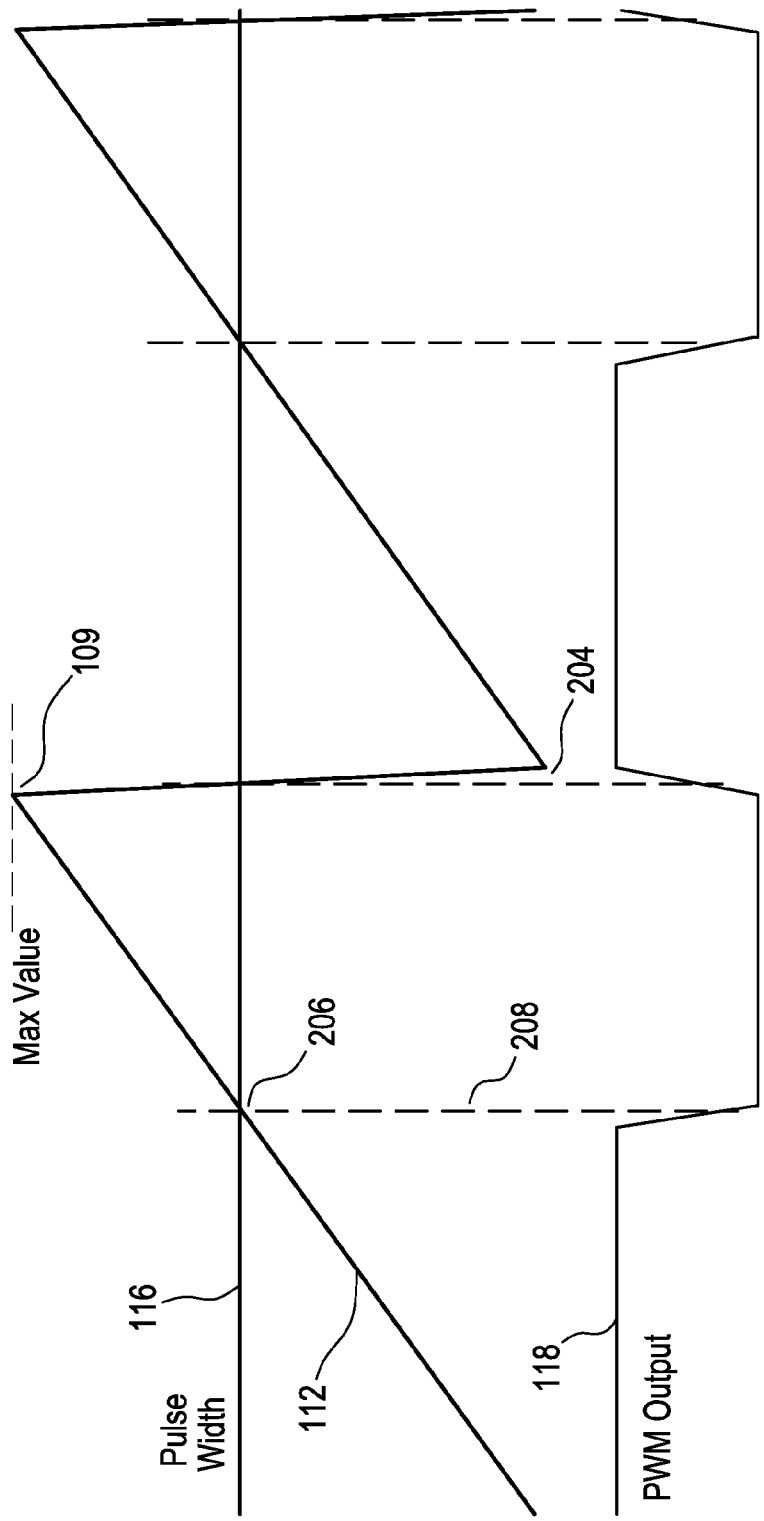
FIG. 2 is a timing diagram of the signals associated with the prior art PWM DAC of FIG. 1.
Figure 3:
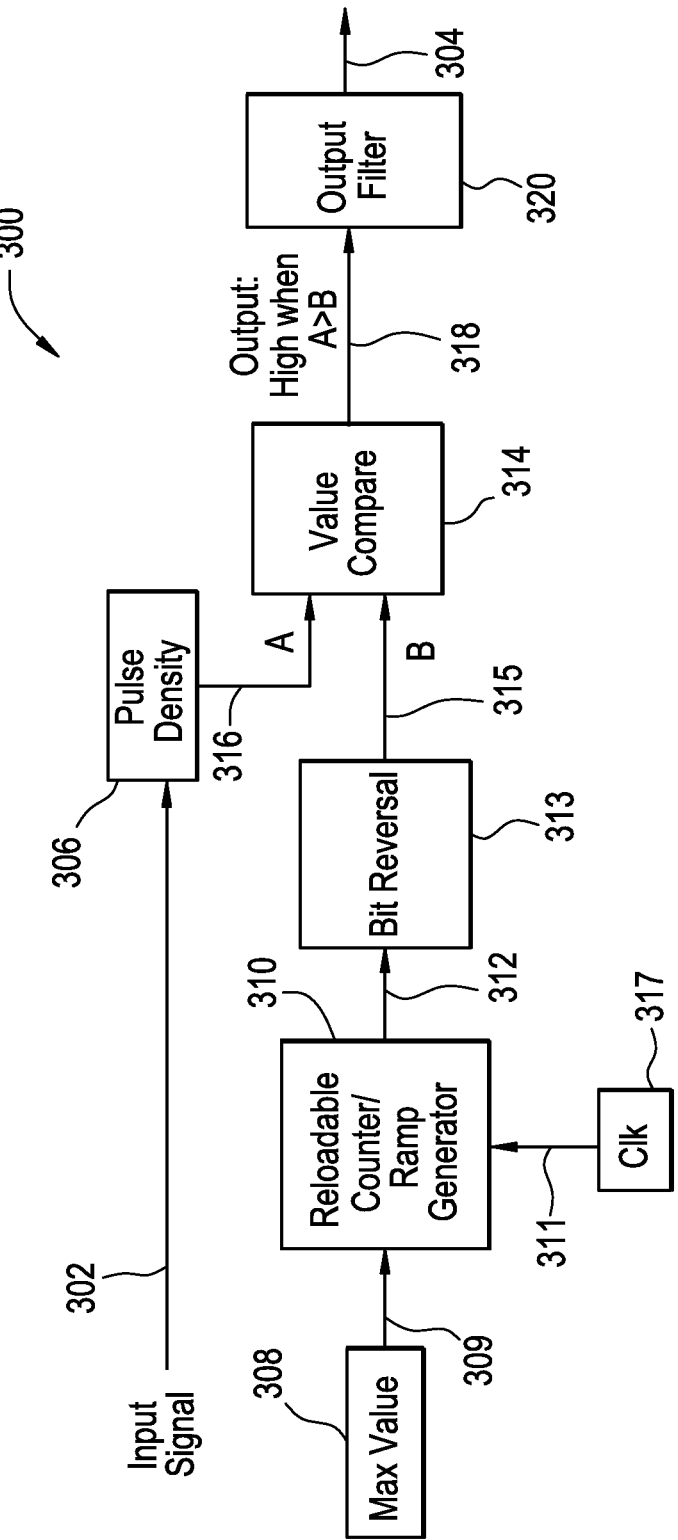
FIG. 3 is a simplified block diagram of a prior art pulse density modulation (PDM) DAC.
Figure 5:
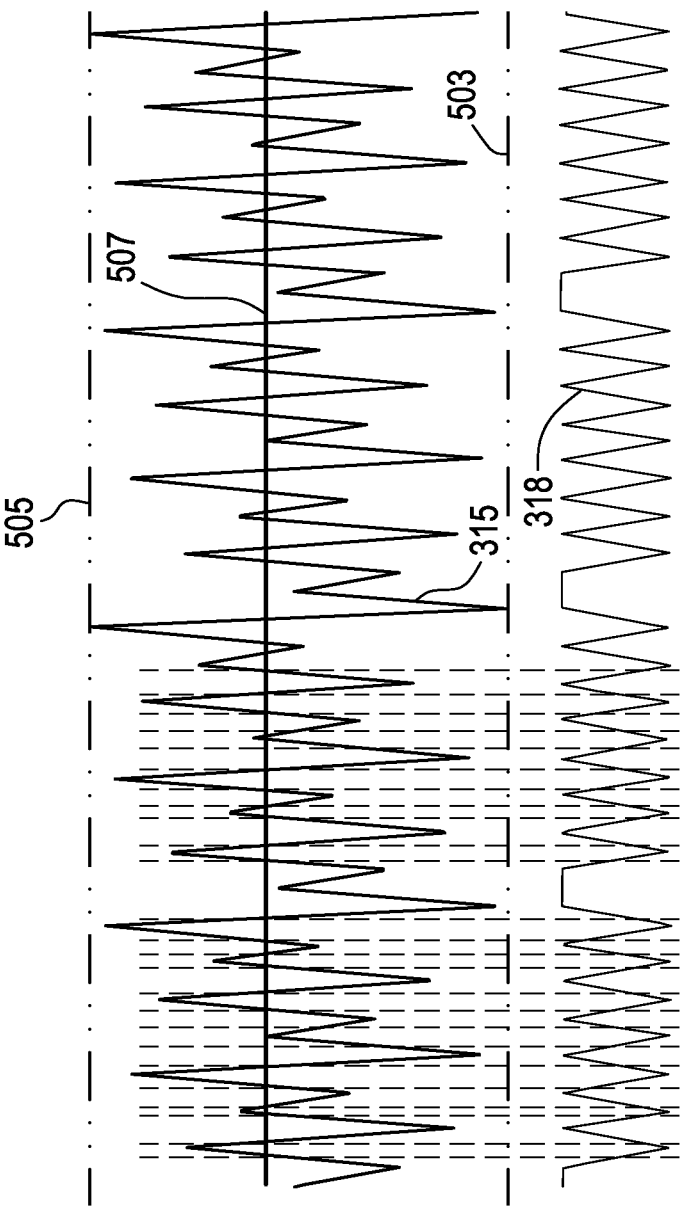
FIG. 5 is a timing diagram of the signals associated with the prior art PWM DAC of FIG. 3.

The output port of the accumulator 604 is coupled to the Accumulator Register 608. The value output from the Accumulator 604 is a 3-bit signed value. The output port of the Accumulator Register 608 is coupled back around to input port 3 of the Accumulator 604. The Accumulator Register 608 stores the value output from the accumulator 604. In accordance with one embodiment of the presently disclosed method and apparatus, the clock signal 311 generated by the clock 317 of the PDM circuit 300 (see FIG. 3) is coupled to a clock input port of the Accumulator Register 608. The clock signal 311 synchronizes the output of the Accumulator Register 608 with the incoming PDM bit stream rate. More particularly, the clock signal 311 to the Accumulator Register 608 clocks the value output from the accumulator 604 into the Accumulator Register 608 each time a new bit is presented at the input port to the accumulator 604 by the incoming PDM bit stream 602.

In one embodiment of the disclosed method and apparatus, a delay is created between the time each bit of the PDM bit stream is received at the first input of the accumulator 604 and the time the output of the accumulator 604 is clocked through to the output port of the accumulator register 608. In one such embodiment, the delay is created by having the value at input port 1 to the Accumulator 604 change on the rising edge of the clock signal 311. The input to the Accumulator Register 608 is clocked through to the output port of the Accumulator Register 608 on the falling edge of the clock signal 311. The Accumulator Register 608 holds that value until the next falling edge of the clock signal 311. Accordingly, all of the input signals at the input ports to the Accumulator 604 will be stable when the value is clocked through (e.g., during the falling edge of the clock signal 311). In accordance with one embodiment of the present invention, the clock signal 311 is output directly from the clock 317 of the PDM circuit 300. Alternatively, the clock signal coupled to clock input port of the Accumulator Register 608 is derived from and synchronized to the output of the clock 317. In one such embodiment, the clock signal may be offset in phase from the clock signal 311. In yet another embodiment, the clock signal may be filtered or otherwise processed to provide edges that are more appropriate to the spreading circuit 600.

In one embodiment of the disclosed method and apparatus, the Accumulator Register 608 is capable of storing 3-bit signed values that range from −4 to 3. However, in one such embodiment, the values that are output from the accumulator 604 will only be in the range of −2 to 2, as will be seen from some examples of the operation of the spreading circuit provided below.

The output port from the Accumulator Register 608 is also coupled to the input port of the comparator 610. The comparator 610 outputs a value of 1 for input values greater than zero. All other values will output a zero. Accordingly, values of −2, −1 and zero output from the Accumulator Register 608 will all cause the output port of the comparator 610 to output a zero. The output port from the comparator 610 is coupled to the output port 618 of the spreading circuit 600 and also to the input port of an inverter 612. The inverter 612 will cause a −1 to be output when a 1 is presented at its input. A zero input to the inverter 612 will result in a zero output. Since the comparator 610 only outputs either a zero or a 1, the output from the inverter 612 is constrained to the values −1 and zero. The output from the inverter 612 is coupled to input port 4 to the accumulator 604.

In one embodiment, the Zero-Sum Sequence Register 606 selects between the four possible zero-sum sequences based on the input from a 2-bit random source, such as the LFSR shown in FIG. 6. Any 2-bit random or pseudo random source can be used to randomize the order in which the sequences are selected from the Zero-Sum Sequence Register 606. The LFSR 614 is clocked by the clock signal 311 divided by 4. A divider 616 divides the clock signal. Accordingly, the LFSR 614 runs at one fourth the frequency of the signal to be spread. Therefore, for every four input bits of the PDM stream 602, the LFSR will select a new zero-sum sequence from the Zero-Sum Sequence Register 606.

FIG. 7 is a table of the values applied to the input ports to the accumulator 604, the sum at the output port of the Accumulator 604 and the values that appear at the output port 618 of the spreading circuit 600. The PDM pulse stream input 602 comprises bits having a value of either zero or 1. FIG. 7 illustrates that a PDM stream having a value of 0, 1, 1, 0, 0, 1, 0, 1 is provided to input port 1 of the accumulator 604 over the time period $t_0$ through $t_7$. A first zero-sum sequence output from the Register 606 is (−1,1,−1,1). This bit sequence is clocked out of the Zero-Sum Sequence Register 606 one bit at a time as controlled by the clock signal 311. These bits are coupled to accumulator input port 2 at times $t_0$, $t_1$, $t_2$, and $t_3$ respectively, as illustrated in FIG. 7. A second zero-sum sequence output from the Register 606 (1,−1,1,−1) is coupled to input port 2 at times $t_4$, $t_5$, $t_6$ and $t_7$ respectively. It should be noted that these sequences are selected randomly by the value generated by the LFSR 614.

The Accumulator Register 608 is initialized to zero at time $t_0$. Accordingly, the output from the Accumulator Register 608 will be zero until another value is presented to the input of the Accumulator Register 608 and that value is clocked through to the output port of the Accumulator Register 608. Therefore, input port 3 to the accumulator 604 is zero at $t_0$. In addition, initializing the value of the Accumulator Register 608 to zero causes the value at time $t_0$ at the output port of the inverter 610 to be zero and thus, input port 4 to the accumulator to be zero. Thus, the output of the spreading circuit 600 is zero at $t_0$. The value output from the accumulator 604 is the sum of these value at time $t_0$. Therefore, the sum of the four values at $t_0$ is −1 at the output port of the Accumulator 604. This value will sit at the input port to the Accumulator Register 608 until clocked through to the output port at time $t_1$.

Once clocked through by the clock signal 311 at $t_1$, the −1 value is coupled to input port 3 to the Accumulator 604. This value is also coupled to the input port to the comparator 610. Since this value is not greater than zero, the output from the comparator 610 remains zero at $t_1$. Likewise, the output of the spreading circuit 600 remains at zero at time $t_1$. Accordingly, the output from the inverter 612 coupled to input port 4 of the Accumulator 604 remains zero at $t_1$. The bit coupled from the PDM stream 602 to input port 1 of the accumulator is 1 at time $t_1$. The second bit output from the Zero-Sum Sequence Register 606 is coupled to input port 2 to the Accumulator 604. That value is a 1 at time $t_1$. Therefore, the sum of the four input ports to the Accumulator 604 is 1 at $t_1$. This is coupled to the Accumulator Register 608.

At $t_2$, the value at the input port of the Accumulator Register 608 is clocked through to the output port of the Accumulator Register 608. Accordingly, the value at input port 3 to the Accumulator 604 at $t_2$ is 1. Since this value is now greater than zero, the output from the comparator 610 is 1. Therefore, at $t_2$, the output of the spreading circuit 600 will be 1. The output from the inverter is then a −1, which is coupled to input port 4 of the accumulator at $t_2$. The PDM stream 602 applied to port 1 of the accumulator has a value of 1 at $t_2$ and the next value of the zero-sum sequence applied to port 2 of the accumulator at $t_2$ is −1. Therefore, the sum at the output port of the accumulator 604 is zero at $t_2$.

At $t_3$, the output from the Accumulator 604 is clocked through to the output port of the Accumulator Register 608. Therefore, the value at input port 3 to the Accumulator 604 is zero. Also, the output from the comparator 610 is zero. The output port of the comparator 610 is coupled to the output port 618 of the spreading circuit 600. Accordingly, a zero is output from the spreading circuit 600. This value is then also applied to the inverter 612, which then outputs a zero. The zero is coupled to input port 4 of the accumulator at $t_3$. The value at input port 1 to the Accumulator 604 is zero at $t_3$. The value at input port 2 to the Accumulator 604 is 1. Therefore, the sum of the four input ports at $t_3$, is 1. This value is then output from the Accumulator 604 and coupled to the input port of the Accumulator Register 608.

At $t_4$, this value is clocked through to the output port of the Accumulator Register 608. When, at $t_4$ the output of the Accumulator Register 608 goes to 1, the comparator 610 outputs a 1 as the output of the spreading circuit 600. In turn, the inverter 612 output a −1 at $t_4$. The sum of the signals at the input ports to the Accumulator 604 at $t_4$ is 1, which is then applied to the input port of the Accumulator Register 608.

At $t_5$, this value is clocked through to the output port of the Accumulator Register 608. When, at $t_5$ the output of the Accumulator Register 608 goes to 1, the comparator 610 outputs a 1 as the output of the spreading circuit 600. In turn, the inverter 612 output a −1 at $t_5$. The sum of the signals at the input ports to the Accumulator 604 at $t_5$ is zero, which is then applied to the input port of the Accumulator Register 608.

At $t_6$, this value is clocked through to the output port of the Accumulator Register 608. When, at $t_6$ the output of the Accumulator Register 608 goes to zero, the comparator 610 outputs a zero as the output of the spreading circuit 600. In turn, the output of the inverter 612 is zero at $t_6$. The sum of the input signals to the Accumulator 604 at $t_6$ is 1, which is then applied to the input port of the Accumulator Register 608.

At $t_7$, this value is clocked through to the output port of the Accumulator Register 608. When, at $t_7$ the output of the Accumulator Register 608 goes to 1, the comparator 610 outputs a 1 as the output of the spreading circuit 600. In turn, the inverter 612 outputs a −1 at $t_7$. This process continues on in similar fashion.

It will be noted that the signal output from the output port 618 of the spreading circuit 600 is a sequence of 0, 0, 1, 0, 1, 1, 0, 1. It should be further noted that the number of pulses output (i.e., 1s output) is equal to the number of pulses applied to input port 1 of the accumulator 604. This will be the case for any sequence of input pulses assuming a valid zero-sum sequence is selected from the Zero-Sum Sequence Register 606. This process would then repeat for each randomly selected zero sum sequence, causing the sequence of pulses output by the spreading circuit 600 to vary in response to the randomly selected zero-sum sequences. This, in turn, will disrupt the otherwise periodic nature of the PDM pulse stream. Thus, the energy output from the spreading circuit 600 will spread in the frequency domain.

Figure 8:
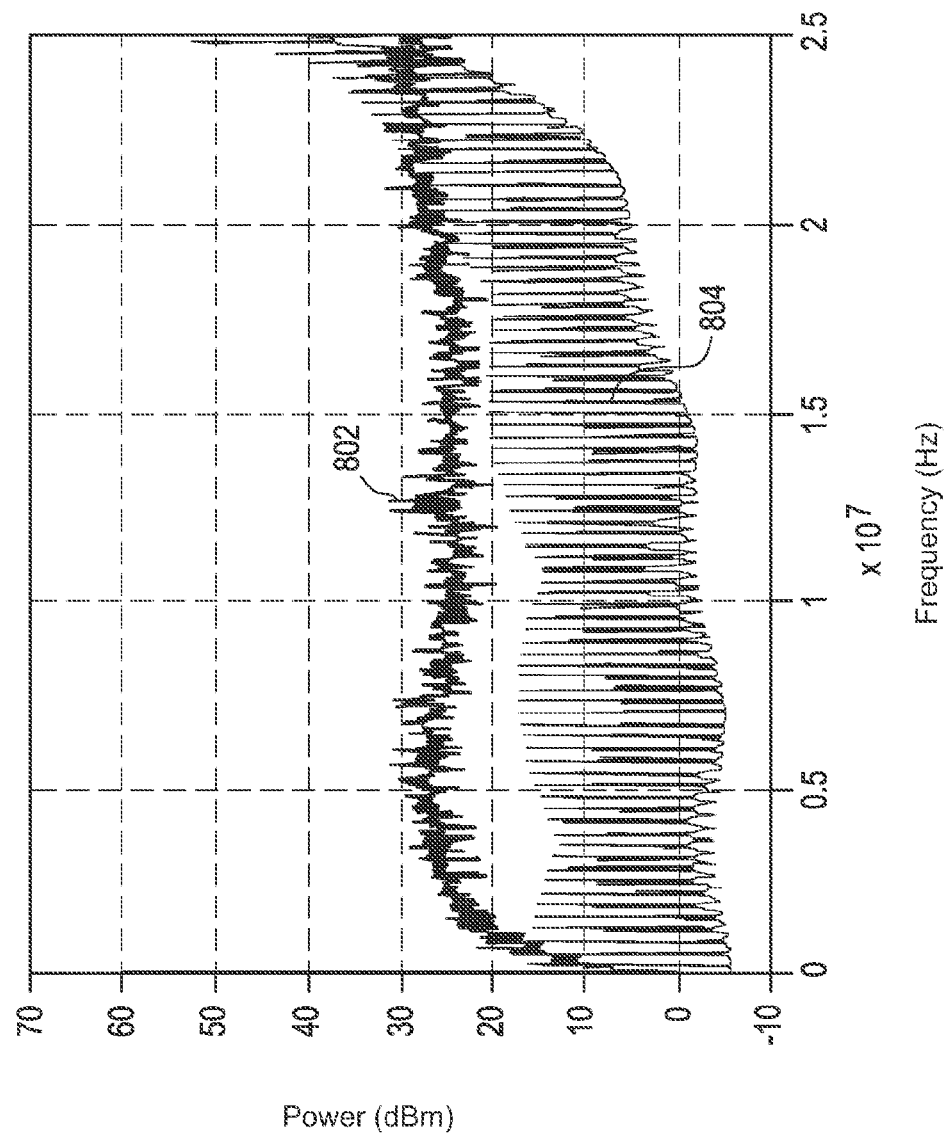
FIG. 8 is an illustration of the spectral density output of the spreading system of FIG. 6 compared to the spectral density of the PDM of FIG. 3.

FIG. 8 is an illustration of the spectral density 802 output of the spreading system compared to the spectral density 804 of the PDM. This data is plotted for an example value (e.g., 131907, or 100000001101000011 in binary) stored in the Pulse Density Register 306 (see FIG. 3), with an example value of (e.g., 262144, or 1000000000000000000 in binary) stored in the Max Value Register 308 (see FIG. 3). The clock signal 311 (see FIG. 3) was set to a clock rate of 50 MHz. Note the very large tone and harmonic power near 25 MHz for the PDM output 804. In contrast, the power is effectively spread over the band by the spreading system in the output 802 of the spreading circuit 600. Note also that near 0 Hz, the spread system has approximately the same amount of noise, so that the low-pass filtered outputs of the PDM output 804 and the spreading circuit output 802 are very similar.

Those skilled in the art will appreciate that the math can be extended to other embodiments. For example, the number of bits in the LFSR 614 can be increased to 3 to allow one of 8 eight-bit zero sum sequences to be selected from the Zero-Sum Sequence Register 606.

Although the disclosed method and apparatus is described above in terms of various examples of embodiments and implementations, it should be understood that the various features, aspects and functionality described in one or more of the individual embodiments are not limited in their applicability to the particular embodiment with which they are described. Thus, the breadth and scope of the claimed invention should not be limited by any of the examples noted above. For example, it will be clear to those skilled in the art that values other than those disclosed above stored in the Zero-Sum Sequence Register 606 can be used as long as the sum of each sequence is zero. In addition, the function performed by the LFSR 614 can be implemented by any random number generator using any technique for generating a random (or pseudo-random) sequence. It should be understood that the more randomly the sequence, the more even the spreading. Still further, the functions of each of the elements of the spreading circuit 600 can be implemented using discrete functions or a programmable module that performs some or all of the functions, a state machine that performs some or all of the functions, or any other means for implementing the functions described above.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosed method and apparatus may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A frequency spreading circuit comprising:LLL
   a) an accumulator having an output port and four input ports, the first input port receiving a signal to be spread;
   b) a source of zero-sum sequences having an output port for outputting zero-sum sequences, the output port coupled to a second input port of the accumulator;
   c) an accumulator register having an output port and an input port, the input port being coupled to the output port of the accumulator and the output port being coupled to the third input port to the accumulator;
   d) a comparator having an input port and an output port, the input port coupled to the output port of the accumulator register, the output port of the comparator providing a stream of pulses, the number of pulses in the stream output from the comparator being equal to the number of pulses input to the first input port of the accumulator; and
   e) an inverter having an input port and an output port, the input port coupled to the output port of the comparator and the output port coupled to the fourth input port to the summer.

2. The frequency spreading circuit of claim 1, wherein the accumulator register is synchronized to the output of the source of zero-sum sequences.

3. The frequency spreading circuit of claim 2, wherein the accumulator register and the source of zero-sum sequences are synchronized to the signal to be spread.

4. The frequency spreading circuit of claim 1, wherein the source of zero-sum sequences is a zero-sum sequence register.

5. The frequency spreading circuit of claim 1, wherein the zero-sum sequences comprise a sequence of 1s and −1s, each zero-sum sequence having an equal number of 1s and −1s.

6. The frequency spreading circuit of claim 4, further comprising a random number generator coupled to the zero-sum sequence register.

7. The frequency spreading circuit of claim 6, wherein the random number generator is a linear feedback shift register (LFSR).

8. The frequency spreading circuit of claim 5, wherein the zero-sum sequences are four bits long.

9. The frequency spreading circuit of claim 8, wherein the LFSR outputs two bits to the source of zero-sum sequences.

10. The frequency spreading circuit of claim 9, wherein the accumulator register and the source of zero-sum sequences are synchronized to the signal to be spread and the LFSR output is synchronized to a clock running at one fourth the frequency of the signal to be spread.

11. The frequency spreading circuit of claim 1, wherein the comparator outputs a 1 if the output of the accumulator register is greater than zero and outputs a zero if the output of the accumulator register is not greater than zero.

12. The frequency spreading circuit of claim 1, wherein the inverter outputs a zero if the input to the inverter is zero and outputs a −1 if the input to the inverter is 1.

13. The frequency spreading circuit of claim 10, wherein the output of the accumulator is a 3-bit signed value.

14. A frequency spread pulse width density modulator comprising:
   a) a pulse width modulator having an output port from which a series of pulses representing the analog value of a digital input is output; and
   b) frequency spreading circuit having an input, the input coupled to the output of the pulse width modulator, wherein the frequency spreading circuit comprises:
      i. an accumulator having an output port and four input ports, a first input port is coupled to the output port of the pulse width modulator;
      ii. a source of zero-sum sequences having an output port for outputting zero-sum sequences, the output port coupled to a second input port to the accumulator;
      iii. an accumulator register having an output port and an input port, the input port being coupled to the output port of the accumulator and the output port being coupled to a third input port to the accumulator;
      iv. a comparator having an input port and an output port, the input port coupled to the output port of the accumulator register, the output port of the comparator providing a stream of pulses, the number of pulses in the stream output from the comparator being equal to the number of pulses input to the first input port of the accumulator; and
      v. an inverter having an input port and an output port, the input port coupled to the output port of the comparator and the output port coupled to a fourth input port to the accumulator.

15. The frequency spread pulse width density modulator of claim 14, wherein the pulse width modulator comprises:
   a) a pulse density register having an output port;
   b) a first comparator, having a first input port and a second input port, the output port of the pulse density register being coupled to the first input port, the output port of the comparator being the output port of the pulse width modulator and coupled to the input of the frequency spreading circuit;
   c) a max value register having an output port;
   d) a ramp generator having an input port and an output port, the input port coupled to the output port of the max value register; and
   e) a bit reversal module having an input port and an output port, the input port being coupled to the output of the ramp generator and the output port being coupled to the second input of the first comparator.

16. A method of spreading the output of a pulse width modulation (PDM) digital to analog converter (DAC), the method comprising:
   a) initializing an accumulator register to zero, the accumulator register having an input port and an output port;
   b) receiving the output of the PDM DAC at a first input port of an accumulator, the output of the PDM DAC comprising a PDM bit stream, the PDM bit stream being received one bit at a time, each bit being synchronized to a clock;
   c) receiving a zero-sum sequence at a second input port of the accumulator, the zero-sum sequence being received one bit at a time, each bit being synchronized with the clock;
   d) receiving an output from the output port of the accumulator at an input port of an accumulator register, the accumulator register being synchronized with the clock to clock the input signal at the input port of the accumulator register through to an output port of the accumulator register sometime after receipt of each bit of the PDM bit stream and prior to receipt of a next bit, thereby creating a delay between the time each bit of the PDM bit stream is received at the first input of the accumulator and the time the output of the accumulator is clocked through to the output port of the accumulator register;
   e) receiving at a third input port of the accumulator the output from the accumulator register;
   f) comparing the output of the accumulator register to zero;

g) receiving a value of 1 at an input port to an inverter if the output of the accumulator register is greater than zero;

h) receiving a zero at the input port to the inverter if the output of the accumulator register is not greater than zero; and i) receiving at a fourth input port of the accumulator a zero if the value at the input port of the inverter is zero and receiving at the fourth input port of the accumulator a value of negative one if the value at the input port of the inverter is one.

17. A tangible, non-transitory computer readable medium for storing instructions which when executed by a processing device will cause the processing device to:

a) sum a first bit of a PDM DAC bit stream with a first bit of a zero-sum sequence to determine a subsequent sum;

b) sum the subsequent sum with a zero if the subsequent sum is not greater than zero and a negative one if the subsequent sum is greater than zero, and with a next bit of the PDM DAC bit stream, and with a next bit of the zero-sum sequence to determine a next subsequent sum; and c) repeat b) for each bit of the PDM DAC bit stream to provide a spread spectrum representation of the PDM DAC bit stream in which each bit of the spread spectrum representation is either a one or a zero depending upon whether the subsequent sum is greater than zero.

* * * * *